(12) United States Patent
Lee (10) Patent No.: US 7,380,338 B2
(45) Date of Patent: Jun. 3, 2008

(54) CIRCUIT BOARD AND MANUFACTURING METHOD THEREOF

(75) Inventor: Yu-Tuan Lee, Taipei (TW)

(73) Assignee: Gigno Technology Co., Ltd., Taipei (TW)

( * ) Notice: Subject to any disclaimer, the term of this patent is extended or adjusted under 35 U.S.C. 154(b) by 0 days.

(21) Appl. No.: 11/158,044

(22) Filed: Jun. 22, 2005

(65) Prior Publication Data

US 2006/0289200 A1 Dec. 28, 2006

(51) Int. Cl.
*H05K 3/02* (2006.01)
*H05K 3/12* (2006.01)
*H01R 9/00* (2006.01)
*H01R 3/00* (2006.01)

(52) U.S. Cl. .................. 29/846; 29/843; 29/848; 174/261

(58) Field of Classification Search ........ 174/261–266, 174/260; 361/774, 777–779, 807–812; 29/842–845, 29/846–854
See application file for complete search history.

(56) References Cited

U.S. PATENT DOCUMENTS

| 4,548,451 | A | * | 10/1985 | Benarr et al. ............... 439/85 |
|---|---|---|---|---|
| 4,813,129 | A | * | 3/1989 | Karnezos ..................... 29/832 |
| 5,081,520 | A | * | 1/1992 | Yoshii et al. ................ 257/702 |
| 5,121,299 | A | * | 6/1992 | Frankeny et al. ............ 361/785 |
| 5,219,639 | A | * | 6/1993 | Sugawara et al. ........... 428/209 |
| 5,245,135 | A | * | 9/1993 | Schreiber et al. ............ 174/261 |
| 5,307,561 | A | * | 5/1994 | Feigenbaum et al. ......... 29/846 |
| 5,436,411 | A | * | 7/1995 | Pasch ........................ 174/261 |
| 5,790,377 | A | * | 8/1998 | Schreiber et al. ............ 361/704 |
| 6,166,333 | A | * | 12/2000 | Crumly et al. .............. 174/255 |
| 6,200,643 | B1 | * | 3/2001 | Sugai et al. ................. 427/475 |
| 6,624,525 | B2 | * | 9/2003 | Anezaki et al. ............. 257/797 |
| 2004/0023433 | A1 | * | 2/2004 | Erikson et al. ............. 438/106 |
| 2006/0028305 | A1 | * | 2/2006 | Dutta et al. ................. 333/238 |

* cited by examiner

*Primary Examiner*—Jeremy C Norris
(74) *Attorney, Agent, or Firm*—Birch, Stewart, Kolasch & Birch, LLP (57) ABSTRACT

A circuit board includes a substrate, an insulating layer, at least one protrusion, and a first circuit layer. The insulating layer is disposed on the substrate and has at least one protrusion-positioning region. At least a part of the protrusion is disposed on the protrusion-positioning region. The first circuit layer is disposed on the insulating layer and has at least one trace line extending onto the protrusion.

18 Claims, 8 Drawing Sheets

CIRCUIT BOARD AND MANUFACTURING METHOD THEREOF

BACKGROUND OF THE INVENTION

1. Field of Invention

The invention relates to a circuit board and a method of manufacturing the same and more particularly to a circuit board formed by way of jetting and a method of manufacturing the same.

2. Related Art

Among the current electrical products, circuit boards, which are indispensable components, may be classified into many types. In terms of application, the circuit boards may be classified into printed circuit boards for carrying various active devices or passive devices, and carrier circuit boards for carrying chips during the packaging process.

The printed circuit board is used for carrying various active devices or passive devices, on a trace line of which a pad is usually formed, or a protrusion may be formed on the pad in order to facilitate the electrical connection to the active device or passive device. In general, most of the protrusions formed on the printed circuit boards are solder bumps, gold protrusions, or the like.

In addition, the carrier circuit board is used for carrying a chip or chips during the packaging process, on a trace line of which a pad is also usually formed, or a protrusion may be formed on the pad in order to facilitate the electrical connection to the chip(s). In general, most of the protrusions formed on the circuit boards are solder bumps, gold protrusions, or the like.

As mentioned above, the trace lines on all kinds of circuit boards are usually formed by way of screen printing or photo-lithography etching, and the protrusions are then formed on the pads of the trace lines. However, owing to the limitation of the technology of forming the trace lines and the substrate material of the circuit board, the line width of the trace lines on the conventional circuit board or the size of the pads on the trace lines cannot be effectively reduced. In other words, the area of the circuit board cannot be effectively reduced, making it impossible to meet the trend to miniaturize electrical products. In addition, the trace lines and protrusions on the conventional circuit board have to be formed through complicated processes, so the manufacturing time or cost cannot be effectively shortened or reduced.

Thus, it is an important subject in the art to provide a circuit board and a manufacturing method thereof, which can effectively reduce the line width of the trace line and the pad size of the circuit board, shorten the time for manufacturing the circuit board and reduce the manufacturing cost.

SUMMARY OF THE INVENTION

In view of the foregoing, the invention provides a circuit board and a manufacturing method thereof capable of effectively reducing the line width of the trace line or the pad size of the circuit board, shortening the time for manufacturing the circuit board, and reducing the manufacturing cost.

To achieve the above, a circuit board according to the invention includes a substrate, an insulating layer, at least one protrusion and a first circuit layer. The insulating layer is disposed on the substrate and has at least one protrusion-positioning region. At least a part of the protrusion is disposed in the protrusion-positioning region of the insulating layer. The first circuit layer is disposed on the insulating layer and is composed of at least one trace line extending onto the protrusion. In addition, the substrate of the invention further includes a second circuit layer disposed on a surface of the substrate. The insulating layer covers the second circuit layer. In this case, the insulating layer further has at least one electrical connection hole, through which the first circuit layer is electrically connected to the second circuit layer.

In addition, a method for manufacturing a circuit board of the invention includes the steps of: forming an insulating layer on a substrate; forming at least one protrusion-positioning region in the insulating layer; forming at least one protrusion in the at least one protrusion-positioning region of the insulating layer; and forming a first circuit layer on the insulating layer with at least one trace line of the first circuit layer extending onto the at least one protrusion. In addition, the method may further include the step of forming a second circuit layer on a surface of the substrate, wherein the insulating layer covers the second circuit layer. In this case, the insulating layer is further formed with at least one electrical connection hole, through which the first circuit layer is electrically connected to the second circuit layer.

As mentioned herein above, the protrusion of the invention may be formed by way of jetting a polymer or a resin material into the protrusion-positioning region. Besides, the first circuit layer can be formed by jetting a solution containing metal particles onto the insulating layer or the protrusion. The second circuit layer can also be formed by jetting a solution containing metal particles onto the substrate.

In brief, the circuit board of the invention and the method of manufacturing the same have the following advantages. Because the protrusion is formed by way of jetting and the first and second circuit layers may also be formed by way of jetting, no complicated procedures, such as the conventional printing or etching procedures, have to be performed. Thus, the circuit board and its manufacturing method of the invention can enable the reduction of the time for manufacturing the circuit board and the manufacturing cost. In addition, because the current jetting technology can achieve narrow line width down to 20 microns or smaller, the circuit board and its manufacturing method of the invention can effectively reduce the line width of the trace line or the pad size on the circuit board.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements. It is to be noted that the circuit board of this invention may be the circuit board for carrying various active devices or passive devices, or the circuit board for carrying a chip or chips during the packaging process.

To make the invention more comprehensive, an example will be described hereinafter for illustrating a circuit board according to a preferred embodiment of the invention.

Figure 1:
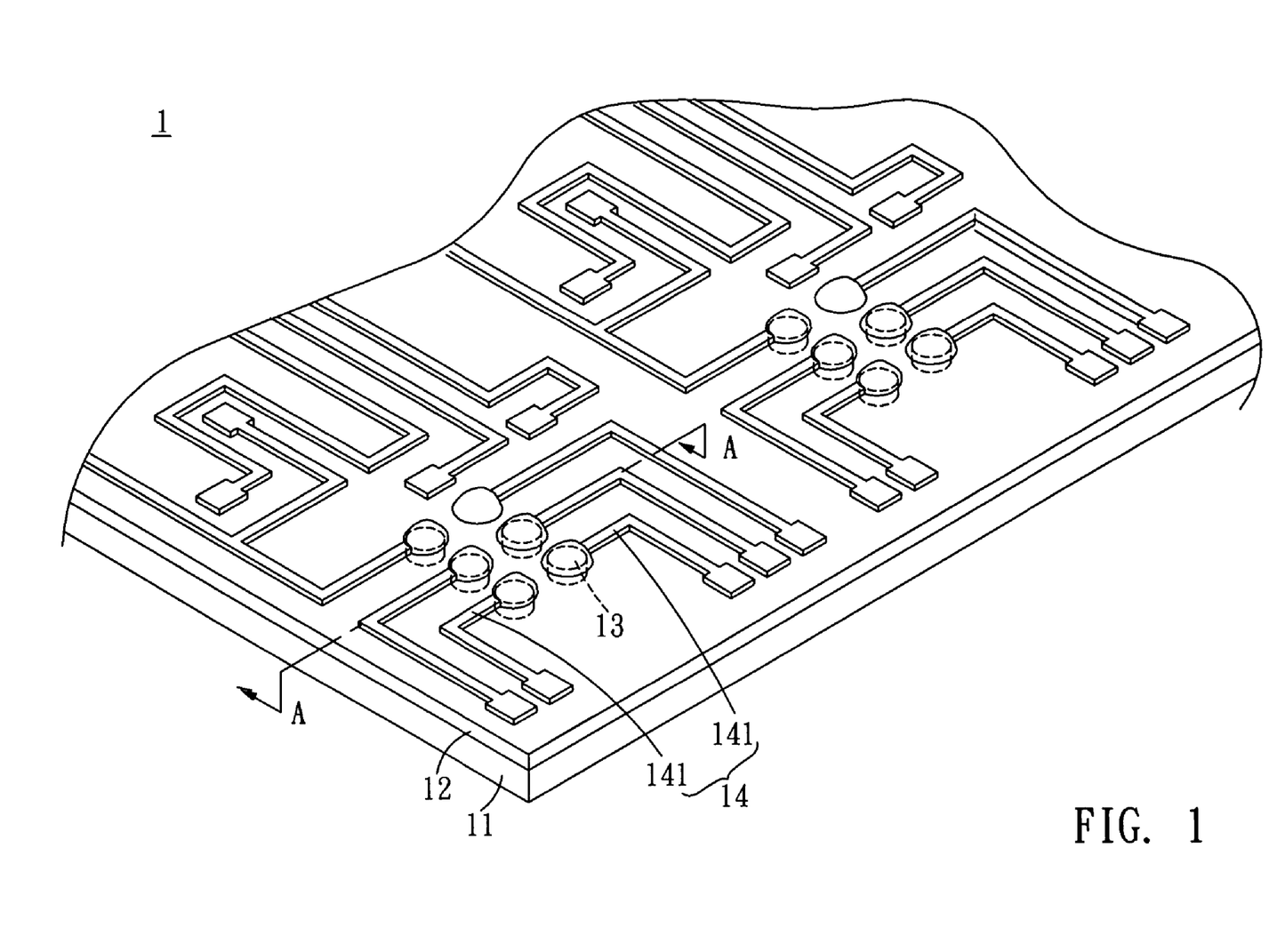
FIG. 1 is a partially schematic illustration of a circuit board according to a preferred embodiment of the invention.

Referring to FIG. 1, the circuit board 1 of the invention includes a substrate 11, an insulating layer 12, at least one protrusion 13 and a first circuit layer 14.

Figure 2:
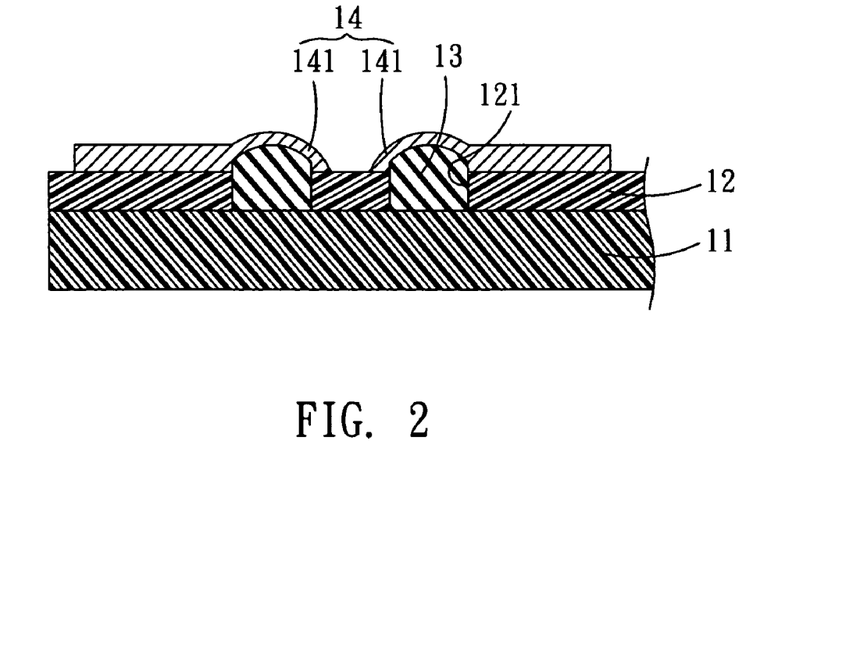
FIG. 2 is a cross-sectional view along the line A-A of FIG. 1.
Figure 3:
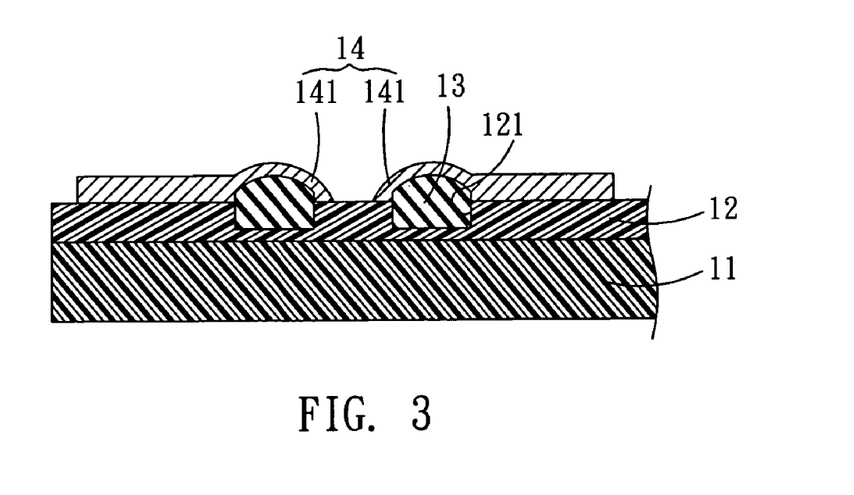
FIG. 3 is another cross-sectional view along the line A-A of FIG. 1.
Figure 7:
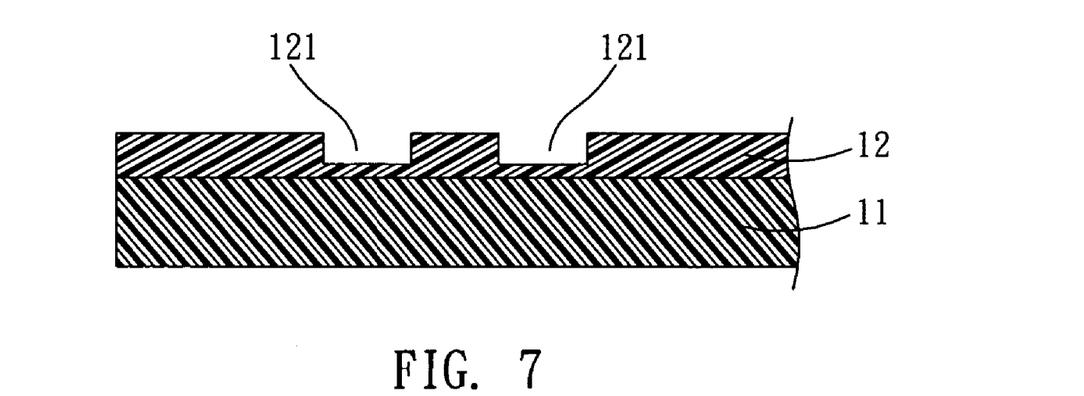

As shown in FIG. 2, the insulating layer 12 is disposed on the substrate 11. The insulating layer 12 has at least one protrusion-positioning region 121. In this embodiment, the protrusion-positioning region 121 in the insulating layer 12 is an opening. However, as shown in FIG. 3, the protrusion-positioning region 121 may be a concave (FIG. 7). The protrusion-positioning region 121 has a protrusion 13. At least a part of the protrusion 13 is disposed in the protrusion-positioning region 121 of the insulating layer 12. The first circuit layer 14 is disposed on the insulating layer 12 with at least one trace line 141 of the first circuit layer 14 extending onto the protrusion 13.

In this embodiment, the substrate 11 is a glass substrate, and the insulating layer 12 includes an organic material or an inorganic material. The inorganic material may be a silicon oxide compound (SiOx), a silicon nitride compound (SiNx), or a silicon oxy-nitride compound (SiOxNy). The protrusion 13 includes a polymer or a resin material. In this embodiment, the protrusion 13 preferably includes an elastic material.

Figure 4:
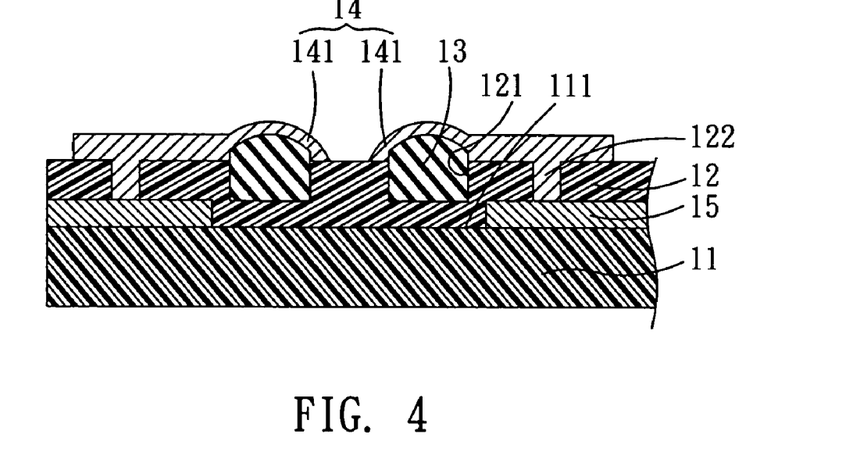
FIG. 4 is a schematically cross-sectional view showing another circuit board according to the preferred embodiment of the invention.

In addition, as shown in FIG. 4, a second circuit layer 15 may be previously formed on the substrate 11 of the circuit board 1. The second circuit layer 15 is disposed on a surface 111 of the substrate 11, and the insulating layer 12 covers the second circuit layer 15. In this case, the insulating layer 12 further has at least one electrical connection hole 122, through which the trace line 141 of the first circuit layer 14 is electrically connected to the second circuit layer 15.

Figure 5:
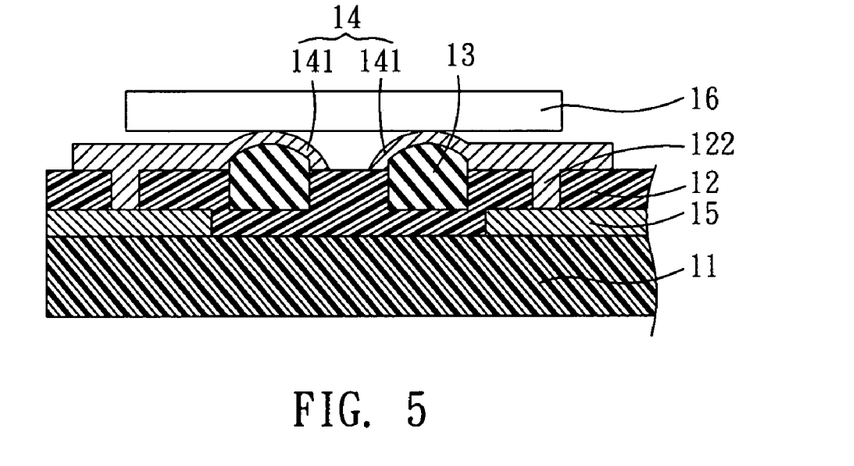
FIG. 5 is a schematically cross-sectional view showing another circuit board having a chip according to the preferred embodiment of the invention.

As shown in FIG. 5, the circuit board 1 may further include an electrical device 16, which may be electrically connected to the trace line 141 of the first circuit layer 14 disposed on the protrusion 13. In this embodiment, the electrical device 16 is a chip bonded to the first circuit layer 14 by way of flip-chip bonding. Of course, the electrical device 16 may also be a passive device or an active device. Because the protrusion 13 of the invention may have elasticity, the chip may be conveniently bonded to the trace line 141 of the first circuit layer 14 on the protrusion 13.

Hereinafter, a method of manufacturing a circuit board according to a preferred embodiment of the invention will be described with reference to FIGS. 6 to 9.

Figure 6:
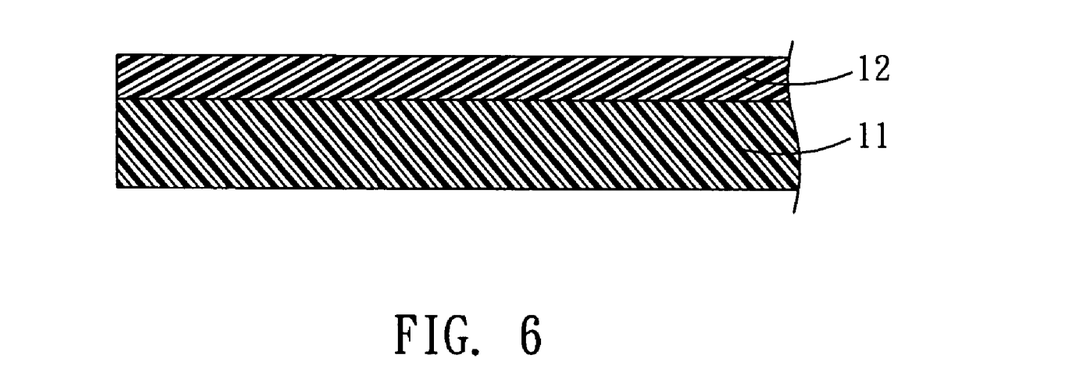
FIGS. 6 to 9 show a method of manufacturing a circuit board according to the preferred embodiment of the invention.

First, an insulating layer 12 is formed on a substrate 11, as shown in FIG. 6. Then, at least one protrusion-positioning region 121 is formed in the insulating layer by way of laser zapping or photo-lithography etching, as shown in FIG. 7. In this embodiment, the protrusion-positioning region 121 is a concave. Alternatively, the protrusion-positioning region 121 may be an opening.

Figure 8:
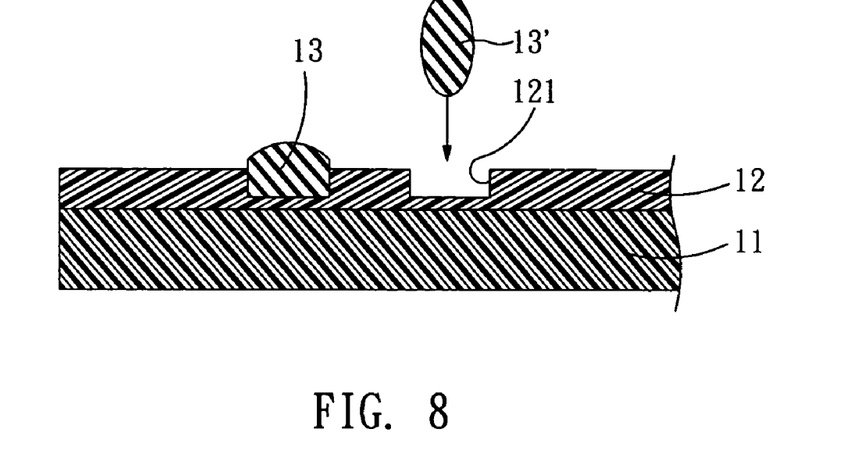

After the protrusion-positioning region 121 is formed, at least one protrusion 13 is formed in the protrusion-positioning region 121, as shown in FIG. 8. The protrusion 13 may be formed by jetting a polymer or a resin material 13' into the protrusion-positioning region 121. In this embodiment, the protrusion 13 preferably includes an elastic material.

Figure 9:
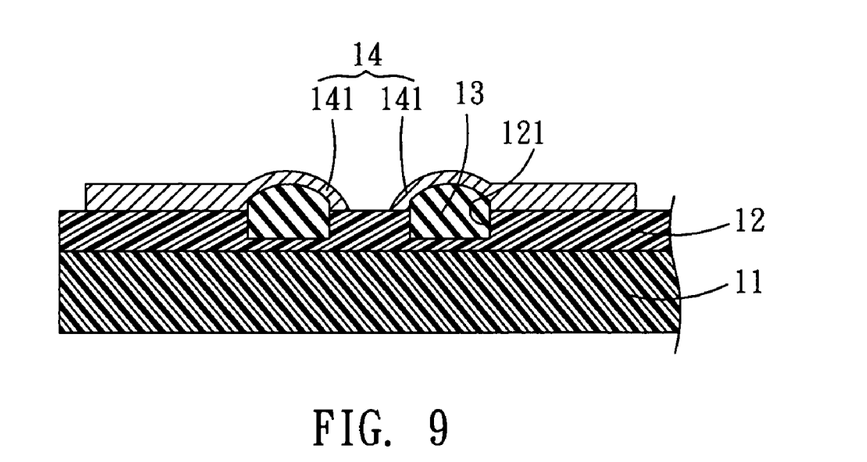

After the protrusion 13 is formed, a first circuit layer 14 is formed on the insulating layer 12, and at least one trace line 141 of the first circuit layer 14 extends onto the protrusion 13, as shown in FIG. 9. At this time, the trace line 141 of the first circuit layer 14 on the protrusion 13 may be electrically connected to an electrical device, such as a chip. In this case, because the protrusion 13 has elasticity, the chip may be conveniently bonded to the trace line 141 of the first circuit layer 14 on the protrusion 13.

In this embodiment, the substrate 11 is a glass substrate and the insulating layer 12 includes an organic material or an inorganic material. The inorganic material may be a silicon oxide compound (SiOx), a silicon nitride compound (SiNx), a silicon oxy-nitride compound (SiOxNy), or the like. The first circuit layer 14 may be formed by jetting a solution containing metal particles onto the insulating layer 12 or the protrusion 13, wherein the metal particles may be silver particles, gold particles, copper particles, or palladium particles.

Hereinafter, another method of manufacturing a circuit board according to a preferred embodiment of the invention will be described with reference to FIGS. 10 to 15.

Figure 10:
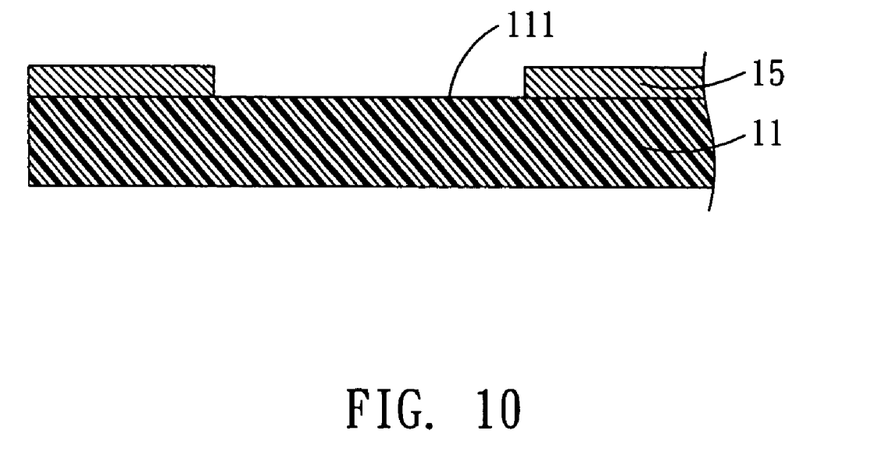
FIGS. 10 to 15 show a method of manufacturing another circuit board according to the preferred embodiment of the invention.

First, a second circuit layer 15 is formed on a surface 111 of the substrate 11, as shown in FIG. 10. In this embodiment, the second circuit layer 15 may be formed by jetting a solution containing metal particles onto the substrate 11, wherein the metal particles may be silver particles, gold particles, copper particles, or palladium particles.

Figure 11:
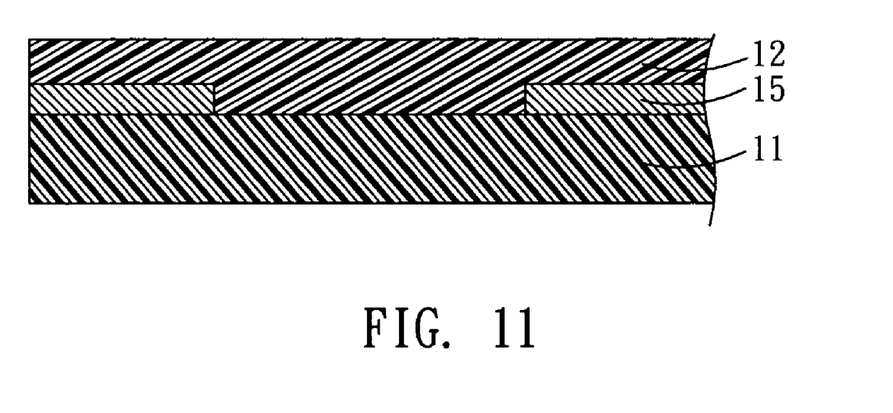

Thereafter, an insulating layer 12 is formed on the substrate 11 to cover the second circuit layer 15, as shown in FIG. 11.

Figure 12:
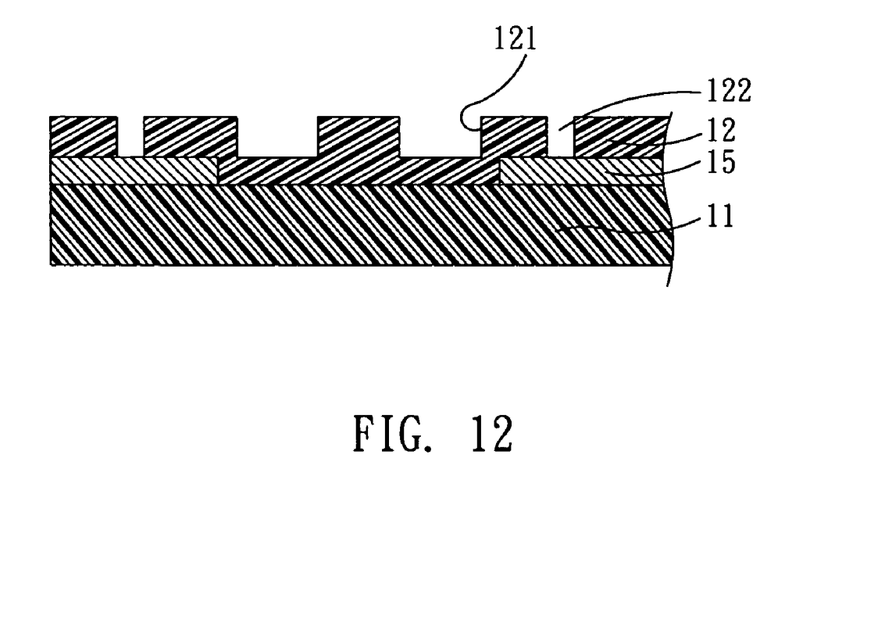

After the insulating layer 12 is formed, at least one protrusion-positioning region 121 and at least one electrical connection hole 122 are formed on the insulating layer by way of laser zapping or photo-lithography etching, as shown in FIG. 12. In this embodiment, the protrusion-positioning region 121 is a concave. Alternatively, the protrusion-positioning region 121 may be an opening.

Figure 13:
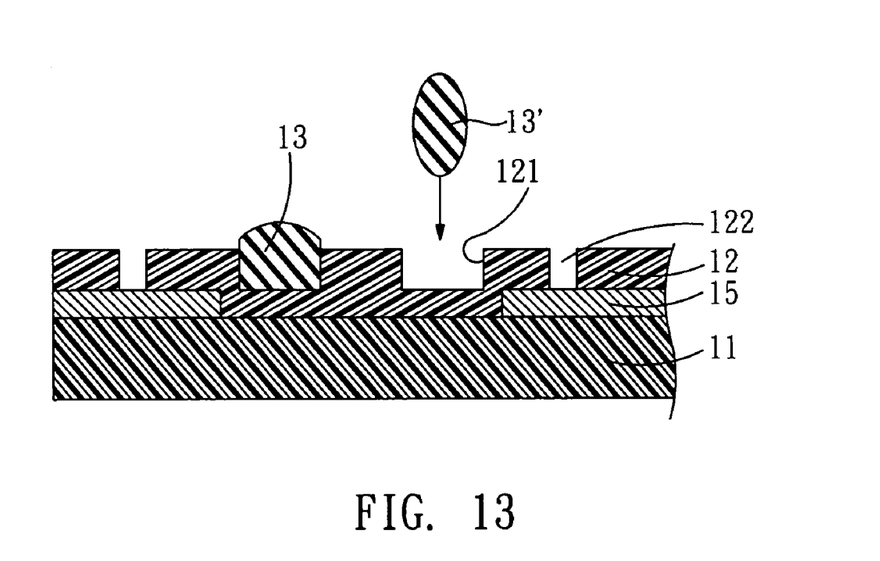

After the protrusion-positioning region 121 and the electrical connection hole 122 are formed, as shown in FIG. 13, at least one protrusion 13 is formed in the protrusion-positioning region 121 by jetting a polymer or a resin material 13' into the protrusion-positioning region 121. In this embodiment, the protrusion 13 preferably includes an elastic material.

Figure 14:
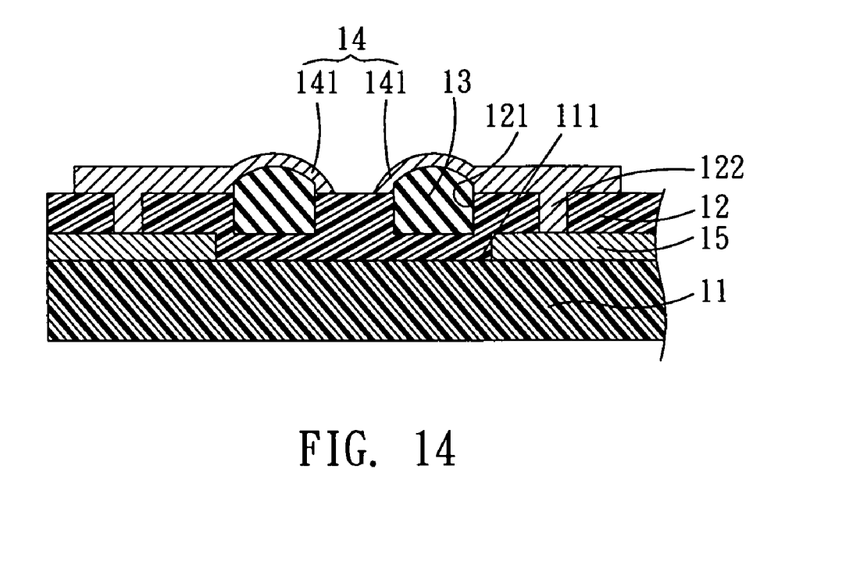
Figure 15:
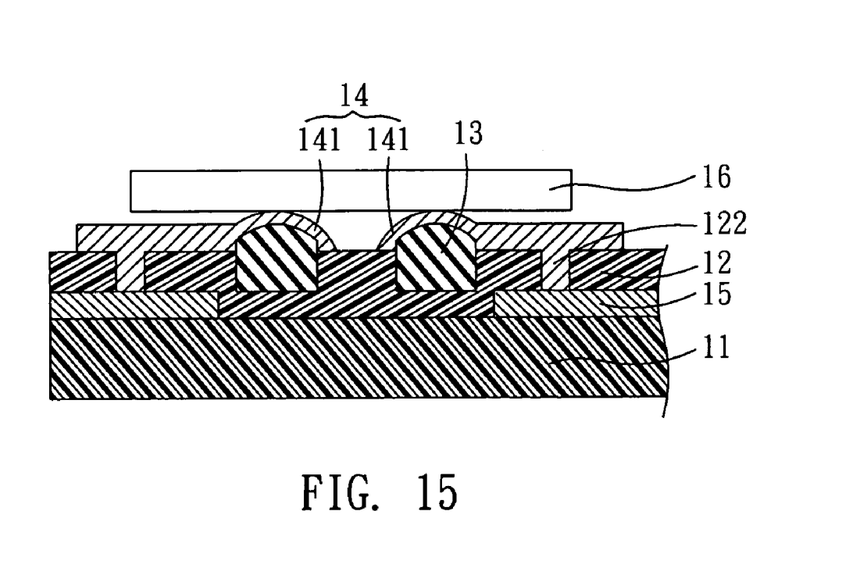

After the protrusion 13 is formed, as shown in FIG. 14, a first circuit layer 14 is formed on the insulating layer 12 with at least one trace line 141 of the first circuit layer 14 extending onto the protrusion 13. In this embodiment, the first circuit layer 14 may be formed by jetting a solution containing metal particles onto the insulating layer 12 or the protrusion 13, wherein the metal particles may be silver particles, gold particles, copper particles, or palladium particles. At this time, as shown in FIG. 15, the trace line 141 of the first circuit layer 14 on the protrusion 13 may be electrically connected to an electrical device 16. In this case, because the protrusion 13 has elasticity, the chip may be conveniently bonded to the trace line 141 of the first circuit layer 14 on the protrusion 13.

In this embodiment, the electrical device 16 is a chip, which is bonded to the first circuit layer 14 by way of flip-chip bonding. Of course, the electrical device 16 may also be a passive device or an active device. In addition, the substrate 11 of this embodiment is a glass substrate, and the insulating layer 12 includes an organic material or an inorganic material. The inorganic material may be a silicon oxide compound (SiOx), a silicon nitride compound (SiNx), a silicon oxy-nitride compound (SiOxNy), or the like.

In summary, the circuit board of the invention and the method of manufacturing the same have the following advantages. Because the protrusion is formed by way of jetting and the first circuit layer and the second circuit layer may also be formed by way of jetting, no complicated procedures, such as the conventional printing or etching procedures, have to be performed. Thus, the circuit board and its manufacturing method of the invention can shorten the time for manufacturing the circuit board and reduce the manufacturing cost. In addition, because the current jetting technology is able to achieve narrow line width down to 20 microns or smaller, the circuit board and its manufacturing method of the invention can effectively reduce the line width of the trace line or the pad size on the circuit board.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method of manufacturing a circuit board, comprising the steps of:
   forming an insulating layer on a glass substrate;
   forming at least one protrusion-positioning region in the insulating layer, the protrusion-positioning region being an opening or a concave;
   forming at least one protrusion in the protrusion-positioning region of the insulating layer and the protrusion is in contact with the insulating layer;
   forming a first circuit layer on the insulating layer, wherein at least one trace line of the first circuit layer extends directly onto the protrusion by way of jetting a solution containing metal particles; and
   electrically connecting an electrical device to the trace line of the first circuit layer on the protrusion.

2. The method according to claim 1, further comprising the step of:
   forming a second circuit layer on a surface of the substrate, wherein the insulating layer covers the second circuit layer.

3. The method according to claim 2, further comprising the step of:
   forming at least one electrical connection hole in the insulating layer after the insulating layer is formed on the substrate, wherein the first circuit layer is electrically connected to the second circuit layer through the electrical connection hole.

4. The method according to claim 3, wherein the electrical connection hole and the protrusion-positioning region are simultaneously formed.

5. The method according to claim 2, wherein the electrical connection hole is formed by way of laser zapping or photo-lithography etching.

6. The method according to claim 2, wherein the second circuit layer is formed by jetting a solution containing metal particles onto the substrate.

7. The method according to claim 6, wherein the metal particles comprise silver particles, gold particles, copper particles, or palladium particles.

8. The method according to claim 1, wherein the protrusion-positioning region is formed by way of laser zapping or photo-lithography etching.

9. The method according to claim 1, wherein the electrical device is a chip bonded to the first circuit layer by way of flip-chip bonding.

10. The method according to claim 1, wherein the first circuit layer is formed by jetting a solution containing metal particles onto the insulating layer or the protrusion.

11. The method according to claim 10, wherein the metal particles comprise silver particles, gold particles, copper particles, or palladium particles.

12. The method according to claim 1, wherein the substrate is a glass substrate.

13. The method according to claim 1, wherein the insulating layer comprises an organic material or an inorganic material.

14. The method according to claim 1, wherein the insulating layer comprises a silicon oxide compound, a silicon nitride compound, or a silicon oxy-nitride compound.

15. The method according to claim 1, wherein the protrusion comprises a polymer or a resin material.

16. The method according to claim 1, wherein the protrusion has elasticity.

17. The method according to claim 1, wherein the protrusion-positioning region of the insulating layer is an opening.

18. The method according to claim 1, wherein the protrusion-positioning region of the insulating layer is a concave.

* * * * *